United States Patent [19]
Teranishi et al.

[11] Patent Number: 5,844,289
[45] Date of Patent: Dec. 1, 1998

[54] SOLID-STATE IMAGE SENSOR WITH MICROLENS AND OPTICAL FIBER BUNDLE

[75] Inventors: Nobukazu Teranishi; Akiyoshi Kohno; Yasumitsu Komatsu, all of Tokyo; Toshihiko Hino; Kazuaki Okumura, both of Shizuoka, all of Japan

[73] Assignees: NEC Corporation, Tokyo; Hamamatsu Photonics K.K., Shizuoka, both of Japan

[21] Appl. No.: 859,908

[22] Filed: May 21, 1997

[30] Foreign Application Priority Data

May 21, 1996 [JP] Japan ................................. 8-125536

[51] Int. Cl.⁶ ..................... H01L 31/0232; H01L 27/148
[52] U.S. Cl. ............................. 257/432; 257/233
[58] Field of Search ................................. 257/232, 233, 257/432

[56] References Cited

U.S. PATENT DOCUMENTS

| | | | |
|---|---|---|---|
| 5,371,397 | 12/1994 | Maegawa et al. | 257/432 |
| 5,479,049 | 12/1995 | Aoki et al. | 257/233 |
| 5,691,548 | 11/1997 | Akio | 257/432 |
| 5,739,548 | 4/1998 | Shigeta | 257/432 |

FOREIGN PATENT DOCUMENTS

| | | |
|---|---|---|
| 2-200074 | 8/1990 | Japan . |
| 4-37165 | 2/1992 | Japan . |

*Primary Examiner*—Gene M. Munson
*Attorney, Agent, or Firm*—Sughrue, Mion, Zinn, Macpeak & Seas, PLLC

[57] ABSTRACT

An improved solid-state image sensor is provided by having an image sensing element composed of photoelectric conversion parts, a microlens formed on the surface of the image sensing element corresponding to each photoelectric conversion part, and optical fiber bundle formed of optical fibers arranged in a two-dimensional shape and mounted on the microlens. The optical fiber bundle is also composed of a core and a clad portion. The refractive index of a filler which mounts the optical fiber bundle on the microlens is less than that of the microlens and greater than that of the clad portion of each of the optical fibers.

8 Claims, 8 Drawing Sheets

SOLID-STATE IMAGE SENSOR WITH MICROLENS AND OPTICAL FIBER BUNDLE

BACKGROUND OF THE INVENTION

1. Field of the Invention

This invention relates to a solid-state image sensor on which an optical fiber bundle is mounted.

2. Description of the Prior Art

In the context of this specification, the term "solid-state sensing element" denotes a part of a semiconductor device such as a CCD, and the term "solid-state image sensor" denotes a device on which an optical fiber bundle is mounted on such a solid-state sensing element. The latter term therefore has a wider meaning.

At present, the most common type of solid-state sensing element is the interline transfer CCD image sensor (ITCCD). As shown in a schematic representation by the plan view of FIG. 1, this ITCCD comprises photoelectric conversion parts 1 arranged in a lattice shape in the horizontal and vertical directions in the principal plane of a silicon substrate, vertical CCDs 2 which transfer in a vertical direction electric charges that have been photoelectrically converted and stored by the photoelectric conversion parts 1, horizontal CCDs 3 which transfer electric charges in a horizontal direction, and an output unit 4. The transfer directions of the electric charges are depicted by the arrows in FIG. 1. As illustrated in FIG. 1, the photoelectric conversion parts 1 and vertical CCDs 2 are alternately arranged on a plan view in the ITCCD. The vertical CCDs 2 serve to shade incident light. Consequently, the aperture ratio of the photoelectric conversion parts 1 is restricted only to the order of 10 to 30%. As a result, the incident light can not be effectively used in the ITCCD. Microlenses formed of a resinous material are therefore disposed above the photoelectric conversion parts 1. With this structure, the incident light is effectively gathered onto the photoelectric conversion parts 1 due to the microlenses. This technology is described in "High Sensitivity CCD Image Sensors Using Resin Lens Arrays" by Ishihara and Tanigaki, National Conference of Television Engineers of Japan 3-17, 1984, and also in Japanese Unexamined Patent Publication No. Hei 4-37165 (namely, 37165/1992) entitled "Solid-State Sensing Element".

FIG. 2 shows a sectional view of picture elements of an ITCCD taken along the horizontal direction of FIG. 1. The illustrated picture elements are substantially equivalent to those proposed in High Sensitivity CCD Image Sensors Using Resin Lens Arrays" by Ishihara and Tanigaki, National Conference of Television Engineers of Japan 3-17, 1984. A P well 5 is formed in the principal plane of an N silicon substrate (not shown). The N photoelectric conversion parts 1 and buried regions 6 of vertical CCDs are formed near the surface of the P well 5. A transfer electrode 8 of one of the vertical CCDs is laid on a gate insulating film over the buried regions 6 and over a transfer gate region 7 between each buried region and the adjacent photoelectric conversion part. This transfer electrode 8 is used to control the transfer of electric charges from the photoelectric conversion part 1 to the buried region 6, and to transfer the electric charges in the vertical direction. A shading film 9, which has an opening above the photoelectric conversion part 1, is formed above the transfer electrode 8 of each vertical CCD. Due to formation of the transfer electrode 8 and the shading film 9, the surface of the vertical CCD is projected from the photoelectric conversion part 1. To compensate for the projections and to adjust a focal length of each microlens to the photoelectric conversion part 1, a smoothing layer 10 is covered on the vertical CCD. This smoothing layer 10 is formed of a transparent material, such as polyglycidyl metaacrylate (PGMA) resin. A microlens 11 of a transparent material, such as Novolak resin, is formed on the smoothing film 10. This microlens 11 is situated in a corresponding position to the photoelectric conversion part 1, and serves to converge incident light on the photoelectric conversion part 1. As a result, the effective aperture ratio is improved twice or three times. A wide variety of resins may be used for the smoothing layer and microlens, and may have refractive indices of the order between 1.57 and 1.7.

FIG. 3 shows an ITCCD (7) picture element which is substantially equivalent to that described in Japanese Unexamined Patent Publication No. Hei 4-37165 (namely, 37165/1992) entitled "Solid-State Sensing Element". Parts identical to those of FIG. 2 are shown by the same symbols. A first smoothing film 12 serves to compensate for projections, and to adjust a focal length of a first microlens 13 onto the photoelectric conversion part 1. The first microlens 13 is formed on the first smoothing film 12. In addition, a second smoothing film 14 is formed to correct irregularities due to the first microlens 13. A second microlens 15 is formed on this second smoothing film 14.

If the refractive index of air is n0, the refractive index of the second microlens 15 is n1, the refractive index of the second smoothing film 14 is n2, the refractive index of the first microlens 13 is n3 and the refractive index of the first smoothing film 12 is n4, the refractive indices have a relation represented by n0<n1, n2<n3, n4. The arrangement of FIG. 3 can converge even incident light which enters at an oblique angle, and is said to have improved sensitivity and less smear.

FIG. 4 shows the external appearance of an optical fiber bundle wherein optical fibers are bundled together. The bundle 16 of optical fibers forms a one-piece construction. An optical fiber bundle 16 of this type has an incidence plane 17 and an output plane 18 perpendicular to the optical axis of the fibers. FIG. 5 shows an enlarged cross-sectional view of the optical fiber bundle 16 taken in a perpendicular direction to the optical axis. Each fiber comprises a core 19 which propagates incident light, a clad portion 20 which covers the outer periphery of the core 19 and an absorption film 21 which covers the outer periphery of the clad portion 20. The core 19 and the clad portion 20 may be referred to as an optical fiber. The absorption film 21 absorbs light which leaks from the core 19 and from the clad portion 20. Thus, adjacent ones of the cores 19 are optically insulated from one another by the absorption film 21. The core 19, the clad portion 20, and the absorption film 21 are respectively formed by the materials enumerated in Table 1. Consequently, the refractive index of the core is 1.621 while the refractive index of the clad portion is 1.519 and is smaller than that of the core.

In general, the refractive index of the core falls within the range between 1.56 and 1.85 while the refractive index of the clad portion falls within the range between 1.47 and 1.52. The optical fibers are often arranged in a hexagonal close-packed structure, as shown in FIG. 5, so as to expand the surface area of the cores 19. The distance between the centers of adjacent cores, i.e. the period of the array, is distributed within a range between 3 μm and 30 μm. This distance

TABLE 1

(% by weight)

| Species | Core | Clad Portion | Absorption Film |
|---|---|---|---|
| Glass Name | $F_2$ | soda-lime glass | black glass |
| $SiO_2$ | 45.7 | 69.9 | 39 |
| $Al_2O_3$ | | 2.0 | |
| $B_2O_3$ | | 1.1 | |
| $Na_2O$ | 3.6 | 16.1 | |
| $K_2O$ | 5.0 | 1.2 | |
| MgO | | 3.2 | |
| CaO | | 6.1 | |
| PbO | 45.1 | | 50 |
| MnO | | | 5 |
| CrO | | | 1 |
| $As_2O_3$ | 0.6 | | |
| $Sb_2O_3$ | | 0.4 | |
| Total | 100 | 100 | 100 |
| Refractive Index | 1.621 | 1.519 | — | tends to become short and short. In FIG. 5, a ratio of a core area in the cross section, namely, a packing fraction is reached from 50% to 75% in the recent fiber bundles.

A solid-state image sensor of the type described above may form a lens-free sensor because an object to be picked up can be directly brought into contact with or adjacent to optical fiber bundles mounted on the solid-state sensing elements. Such a sensor is advantageous in that is becomes small in size.

An alternative optical image sensor having sensitivity to X-rays may also be constructed by coating an X-ray fluorescent material on the incidence end face of the optical fiber bundle. Such a solid-state image sensor is shown in FIG. 6 and has an optical fiber bundle 26 mounted on a solid-state sensing element 22, as shown in cross-section in FIG. 6. The solid-state sensing element 22 is also mounted on a ceramic package 23, and is electrically connected through bonding wires 24. External electrical connections are provided by a plurality of pins 25. The optical fiber bundle 26 is attached so as to cover an image area of the solid-state sensing element 22 which has photoelectric conversion parts are formed.

FIG. 7 shows a cross-section of a picture element part which comprises those parts similar to the solid-state sensing element of FIG. 2 and the optical fiber bundle of FIG. 5 but which are simplified in FIG. 7. In FIG. 7, photoelectric conversion parts 28 through 34 are formed in a P well 27 on a principal surface of a N semiconductor substrate. Vertical CCDs or the like (not shown) are formed between these photoelectric conversion parts 28 to 34, and shading or opaque films 35 are located above the substrate. An optical fiber bundle depicted by 37 is mounted on this solid-state sensing element 36 with a transparent filler 38 interposed between the bundle 37 and the element 36. The optical fiber bundle 37 comprises cores 39 and clad portions 40, and absorption films (not shown) which are placed between the centers of the clad portions 40.

Light incident on the optical fiber bundle 37 is propagated through the cores 39, and reaches the solid-state imaging element 36 via the filler 38. Light which enters the photoelectric conversion parts 28 to 34 of the solid-state imaging element 36 is photoelectrically converted to an electric charge.

This conventional solid-state imaging element on which an optical fiber bundle is mounted has the following disadvantages.

Due to the presence of the transfer electrodes and the shading film 35, the surfaces of the vertical CCDs are projected from those of the photoelectric conversion parts 28 to 34. In other words, the photoelectric conversion parts 28 to 34 are recessed relative to the vertical CCDs.

A silicon oxide film 41 is formed on the photoelectric conversion parts 28 to 34 and has a refractive index of about 1.45. This shows that the refractive index of the silicon oxide film 41 is less than the refractive index of 1.57 given by an epoxy resin adhesive used as the filler 38. The recessions in the photoelectric conversion parts 28 to 34 therefore act as convex lenses. As incident light is refracted in a direction towards the outside of the photoelectric conversion parts 28 to 34, which results in a reduction of sensitivity and causes smear or crosstalk to occur.

The optical fiber bundle 37 has normally a fine hexagonal close-packed structure or lattice while the solid-state sensing element 36 is normally shaped into a longitudinal lattice. Thus, the illustrated structure has different types of lattices. Moreover, the two lattices have pitches or periods different from each other. The aperture ratios of both the optical fiber bundle 37 and the solid-state imaging element 36 are not 100%, and are finite. In particular, in the case of an interline transfer CCD device which is most often used, the aperture ratio is only 10 to 30%. The aperture ratio of the optical fiber bundle is 50 to 75%. This leads to the formation of Moire fringes in which some picture elements have a high sensitivity and some do not. Consequently, an unpleasant image is displayed.

In FIG. 7, it is to be noted that three periods of the solid-state imaging element 36 and five periods of the optical fiber bundle 37 have the same length. The photoelectric conversion parts 28, 31, 34 are located directly above core centers of the cores 39 so the sensitivity at these parts is comparatively high. On the other hand, the remaining parts 29, 30, 32, and 33 are displaced from core centers and are partially overlapped with the clad portions 40. Hence, the sensitivity of these parts is comparatively low. This arrangement is therefore disadvantageous in that Moire fringes are objectionably formed.

SUMMARY OF THE INVENTION

It is an object of this invention to provide a solid-state image sensor which is capable of improving sensitivity and avoiding formation of Moire fringes.

According to this invention, a solid-state image sensor comprises a solid-state sensing element having photoelectric conversion parts formed in a two-dimensional shape in the principal surface of a semiconductor substrate, a microlens which corresponds to each of the photoelectric conversion parts and which is provided on the surface of the solid-state sensing element, and an optical fiber bundle which has optical fibers two-dimensionally arranged on the microlens.

According to this invention, a solid-state image sensor is obtained wherein the refractive index of a filler which mounts the optical fiber bundle on the microlens is less than the refractive index of the microlens and greater than the refractive index of a clad portion of each of the optical fibers used for the optical fiber bundle.

According to this invention, a solid-state image sensor is obtained wherein one end face of the optical fiber bundle is pressed onto the microlens.

According to this invention, a solid-state image sensor is obtained wherein a difference between the refractive index of the microlens and the refractive index of the cores of the optical fibers used for the optical fiber bundle is 0.3 or less, and the refractive index of a filler which mounts the optical fiber bundle on the microlens is less than the refractive index of the microlens and greater than the refractive index of the clad portion of each of the optical fibers used for the optical fiber bundle.

According to this invention, the array formed by the photoelectric conversion parts is the same as the array formed by said optical fibers, a one-to-one correspondence existing between the photoelectric conversion parts and the optical fibers.

According to this invention, a solid-state image sensor is obtained comprising a solid-state sensing element having photoelectric conversion parts formed in a two-dimensional rectangular lattice shape in the principal surface of a semiconductor substrate, a microlens corresponding to each of the photoelectric conversion parts provided on the surface of the element, and an optical fiber bundle comprising optical fibers arranged in a two-dimensional fine hexagonal close-packed structure mounted on the microlens.

According to this invention, a solid-state image sensor is obtained wherein an angle between the shape formed by the photoelectric conversion parts and the shape formed by the optical fibers is between 10° and 20°, in order that points of the array formed by the photoelectric conversion parts and points of the shape formed by the optical fibers do not overlap with a fixed period.

According to this invention, a solid-state image sensor is obtained comprising a solid-state sensing element having photoelectric conversion parts formed in a two-dimensional shape in the principal surface of a semiconductor substrate, a microlens corresponding to each of the photoelectric conversion parts provided on the surface of the element, and an optical fiber bundle composed of optical fibers arranged in a two-dimensional shape mounted on the microlens and having a period different from that of the shape of the photoelect conversion parts.

DESCRIPTION OF THE PREFERRED EMBODIMENTS

Figure 2:
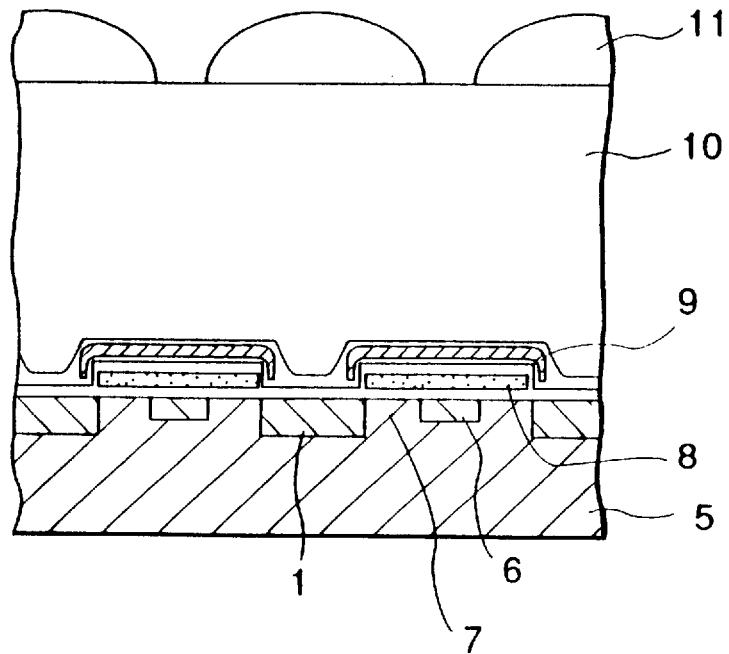
FIG. 2 is an enlarged sectional view of a conventional interline transfer CCD in which microlenses are formed.
Figure 6:
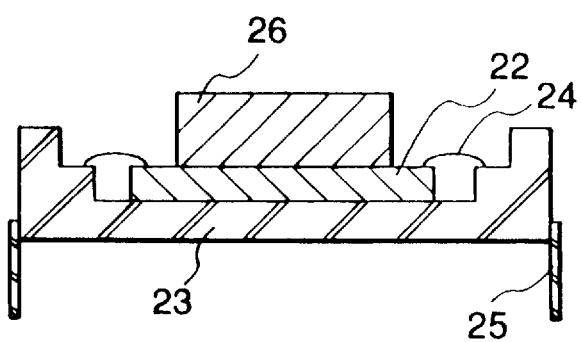
FIG. 6 is a sectional view of a conventional solid-state image sensor on which the optical fiber bundle is mounted.
Figure 8:
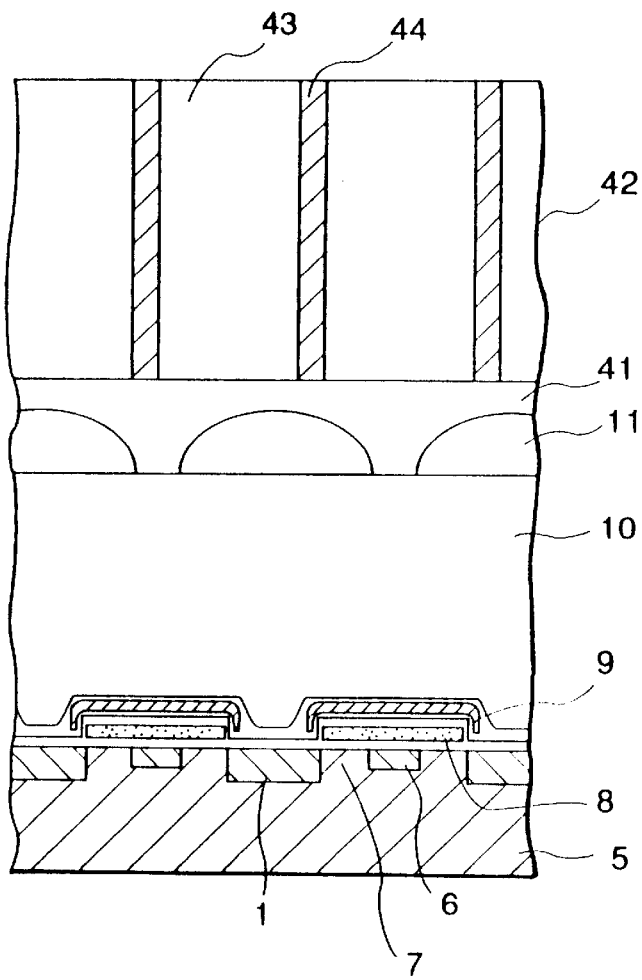
FIG. 8 is an enlarged sectional view of a solid-state image sensor according to a first, second, third and fourth embodiment of this invention.

Next, some preferred embodiments of this invention will be described with reference to the appended figures and drawings. A solid-state image sensor according to a first embodiment of this invention comprises an optical fiber bundle mounted on a solid-state imaging element wherein microlenses are formed corresponding to photoelectric conversion parts, and has an identical cross-section to that of FIG. 6. FIG. 8 shows an enlarged cross-section of a picture element part having the features and characteristics of this invention. Component elements are identical to those of FIG. 2, showing a solid-state imaging element in which microlenses are formed, and depicted by the same symbols. FIG. 8 shows an interline transfer CCD device wherein photoelectric conversion parts 1 are disposed in a longitudinal lattice like in FIG. 2. The smoothing film 10 and microlenses 11 are also identical to those of FIG. 2. An optical fiber bundle 42 is mounted above the imaging element with a filler 41 of a transparent adhesive or the like interposed between the element and bundle. The optical fiber bundle 42 comprises cores 43 and clad portions 44, and absorption films which are placed between the centers of the clad portions 44 and which are not shown in this figure.

Light incident on the optical fiber bundle 42 is propagated through the cores 43, and passes through the filler 41 so as to be incident on the microlenses 11. The light is converged to the photoelectric conversion parts 1 by the microlenses 11. In the photoelectric conversion parts 1, the incident light is converted to an electric charge. As the effective aperture ratio of the photoelectric conversion parts 1 is increased by twice or three times by the microlenses 11, sensitivity is enhanced. Moreover, non-uniformity of sensitivity is decreased which might result from different lattices formed by the photoelectric conversion parts 1 and the cores 43. As a result, the ratio of maximum sensitivity to minimum sensitivity is reduced, which enables a reduction of Moire fringes occurring due to non-uniform sensitivity.

Figure 7:
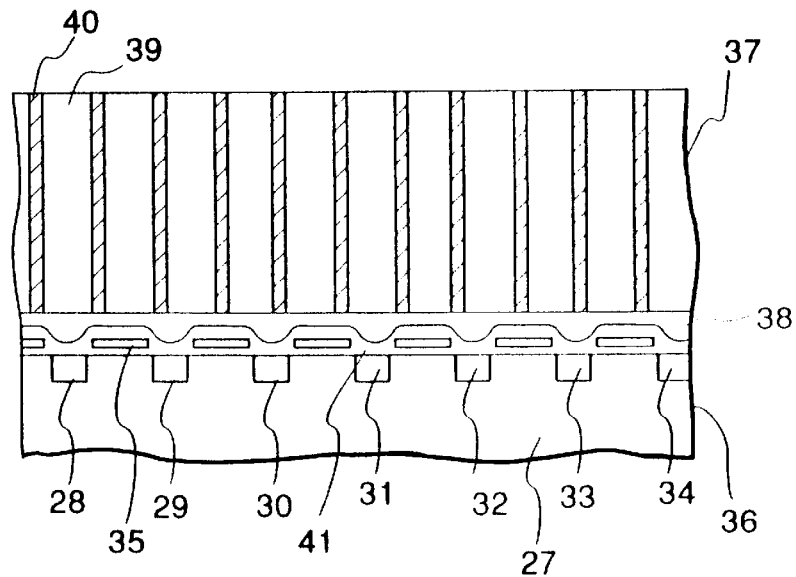
FIG. 7 is an enlarged sectional view of a conventional solid-state image sensor on which an optical fiber bundle is mounted.

Due to the provision of the smoothing film 10 having effectively the same refractive index as that of the oxide film formed on the surface of the solid-state imaging element, there is no convex lens effect of the filler in the depressions of the photoelectric conversion parts which occurred in the solid-state image sensor shown in FIG. 7, any reduction of sensitivity, and smear and crosstalk do not take place.

Next, a second embodiment of this invention will be described. In the solid-state image sensor according to the second embodiment of this invention, special attention is paid to the refractive index of the filler 41 in the solid-state image sensor of FIG. 8. A convex lens effect of the microlenses 11, which form upward bulges or projections may be achieved by using the filler which has the refractive index less than that of the microlenses 11. A difference between the refractive indexes is preferably equal to or greater than 0.1.

Figure 1:
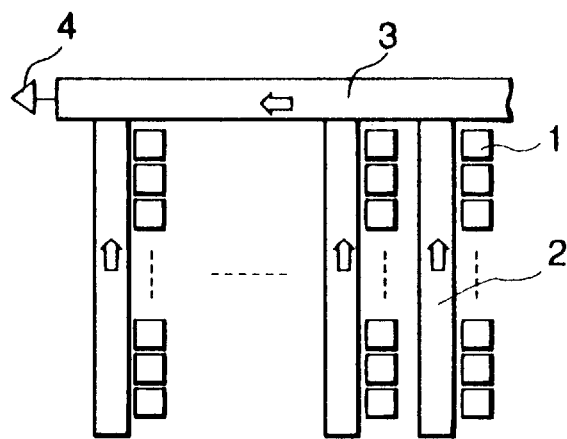
FIG. 1 is a schematic plan view of a conventional interline transfer CCD.

Next, a third embodiment of this invention will be described. In the solid-state image sensor according to the third embodiment of this invention, the photoelectric conversion parts 1 of the solid-state imaging element are arranged in a shape of a rectangular lattice shown in FIG. 1. On the other hand, the cores of the optical fiber bundle mounted above the element are arranged in a fine hexagonal close-packed structure like in FIG. 5.

In the solid-state imaging element, the photoelectric conversion parts are normally arranged in the rectangular lattice shape, as mentioned before. The rectangular lattice shape may be replaced by a square lattice shape in consideration of ease of design. As the arrangements are different between the photoelectric conversion parts and the cores of the optical fiber bundle, Moire fringes tend to appear due to non-uniform sensitivity. However, the effective aperture ratio is improved by twice or three times due to the microlenses and reaches 40 to 80%. As a result, a reduction of sensitivity can be considerably avoided even when the cores are remote from positions located directly above the photoelectric conversion parts. Thus, Moire fringes are reduced.

Next, a fourth embodiment of this invention will be described. In the solid-state image sensor according to the fourth embodiment of this invention, the period of the arrangement of photoelectric conversion parts of the solid-state imaging element is different from the period of the arrangement of cores in the optical fiber bundle. Such a difference of the periods might bring about occurrence of Moire fringes due to non-uniformity of sensitivity. However, the effective aperture ratio is improved by twice or three times due to the microlenses and reaches 40 to 80%. As a result, a reduction of sensitivity can be remarkably avoided even when the cores are not aligned directly above the photoelectric conversion parts. Thus, the Moire fringes are reduced.

Figure 5:
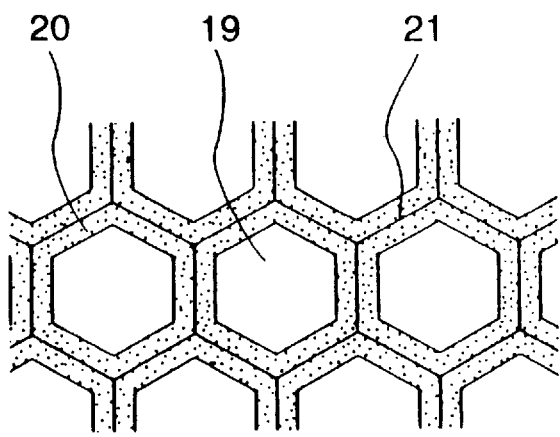
FIG. 5 is an enlarged sectional view of the optical fiber bundle shown in FIG. 4.
Figure 9:
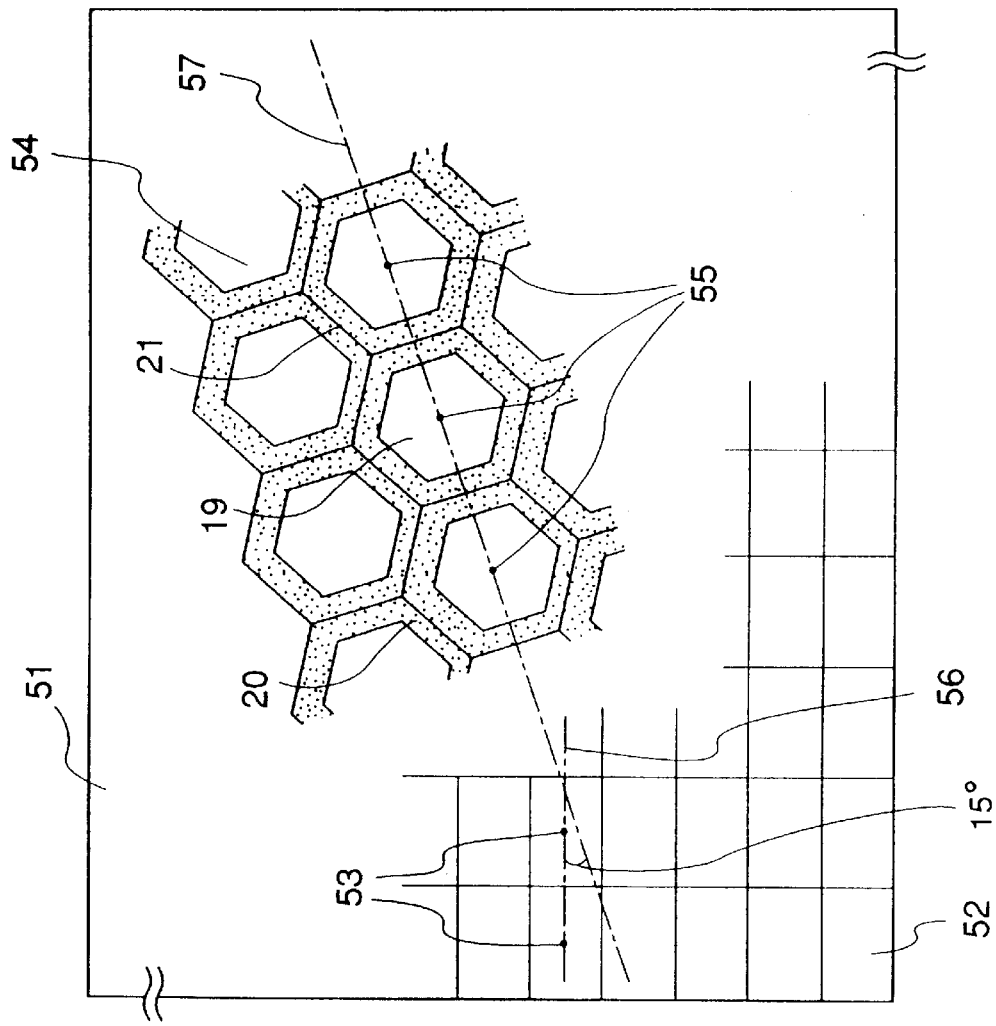
FIG. 9 is a schematic plan view of a solid-state image sensor according to a fifth embodiment of this invention.

Next, a fifth embodiment of this invention will be described. Referring to FIG. 9, the solid-state image sensor according to the fifth embodiment of this invention has a solid-state imaging element 51 which has microlenses and photoelectric conversion parts disposed in a rectangular lattice shape. As mentioned above, the photoelectric conversion parts are disposed in the rectangular lattice shape. This means that specific points in the photoelectric conversion parts of each picture element 52, e.g. the centers 53 of the openings are also disposed in the rectangular lattice shape. In an optical fiber bundle 54 mounted on the solid-state imaging element, component elements which are identical to those of FIG. 5 are designated by the same symbols. Centers 55 of the cores of the optical fiber bundle form a fine hexagonal close-packed structure, as illustrated in FIG. 9. At least one first straight line 56 connected to the centers 53 of the nearest openings of the solid-state imaging element is inclined at an angle of 15° with at least one second straight line 57 connected to the centers 55 of the nearest cores of the optical fiber bundle 54.

By disposing the solid-state imaging element 51 and optical fiber bundle 54 in this manner, the lattice points of the picture elements 52, i.e. the photoelectric conversion parts are not overlapped with the lattice points of the cores 19 of the optical fiber bundle 54 at a predetermined period or distance. With this structure, it is possible to reduce Moire fringes which might result from the lattice of picture elements of the solid-state imaging element 51 and the lattice of the cores 19 of the optical fiber bundles 54, are thereby reduced. Herein, a fluctuation of sensitivity is defined as follows:

Fluctuation of sensitivity (%)=100×((maximum sensitivity in picture element)−(minimum sensitivity in picture element))/(maximum sensitivity in picture element)

According to the inventors' experimental studies, when the angle formed by the first straight line 56 and second straight line 57 are equal to 0°, the fluctuation of sensitivity was reached to 18%. However, when the angle formed by the first straight line 56 and second straight line 57 was equal to 15°, the fluctuation of sensitivity was reduced to 7%. Due to the presence of the microlenses, the sensor has a large effective aperture ratio. This serves to reduce the fluctuation of sensitivity and to widen an angle range in which the fluctuation can be reduced, even when the angle between the first straight line 56 and the second straight line 57 is displaced from 15°. Such a reduction of the fluctuation can in fact be obtained when the angle between the first straight line 56 and the second straight line 57 falls within a range between 10° and 20°.

Figure 10:
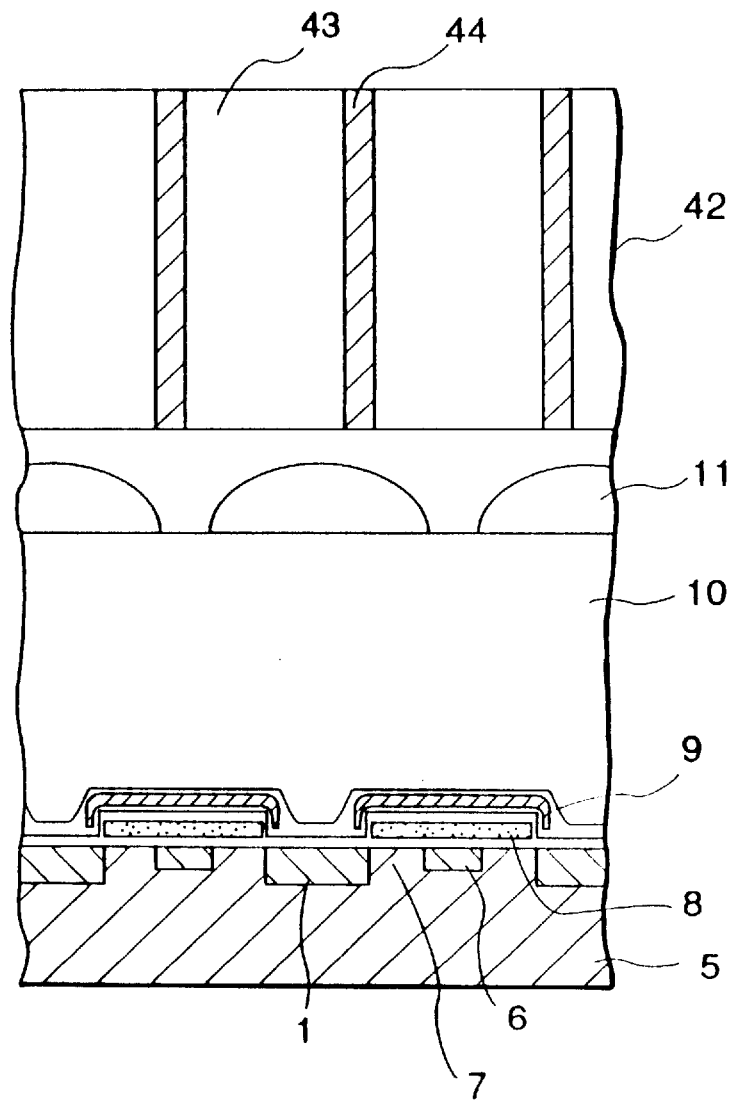
FIG. 10 is an enlarged sectional view of a solid-state image sensor according to a sixth and seventh embodiment of this invention.

Next, a sixth embodiment of this invention will be described with reference to the sectional view shown in FIG. 10. Component elements which are identical to those of FIG. 8 and FIG. 2 are designated by the same symbols. The microlenses 11 are formed of a transparent resin, and they are projected upwards and are therefore deformed elastically when pressed from above. By using this elastic deformation property, the optical fiber bundle 42 is pressed onto the microlenses 11 in the illustrated solid-state image sensor. Hence, the microlenses 11 are deformed and flattened on their upper surfaces. As a result, the microlenses 11 are brought into intimate contact with the output end surfaces, namely, lower end surfaces of the optical fiber bundle 42. The cores 43 have the refractive index between 1.56 and 1.85, which is comparatively large for glass. The microlenses 11 has the refractive index between 1.57 and 1.70 which is comparatively large for resin. The filler 45 has the refractive index between 1.53 and 1.58, which is low.

With this structure, light is propagated from the cores 43 of a high refractive index through the filler 45 of a low refractive index to the microlenses 11 of a high refractive index. During this propagation of light, reflection on the interfaces take place, which reduces luminous energy reached to the photoelectric conversion parts. However, according to the solid-state image sensor of the sixth embodiment, light is propagated directly from the cores 43 to the microlenses 11. Therefore, if reflecting surfaces can be decreased, the luminous energy lost by reflection is reduced. Also the refractive indices of the cores 43 and microlenses 11 are close to each other, so reflection is small. This effect is obtained not only when the optical fiber bundle 42 is pressed against the microlenses 11 so that their upper parts are flattened and the bundle 42 is in intimate contact with the microlenses 11, but also when the bundle 42 and microlenses 11 are merely touched each other.

Next, a seventh embodiment of this invention will be described with reference to FIG. 10 also. In a solid-state image sensor according to the seventh embodiment of this invention, the refractive index difference between the cores 43 and the microlenses 11 is adjusted to 0.3 or less. When the refractive index of the cores is 1.5 to 1.9, the reflection rate of light which is perpendicularly incident is reduced to 4% or less. Therefore, the reflection may be practically neglected. This improves a light utilization rate and enhances sensitivity.

Next, an eighth embodiment of this invention will be described. In the solid-state image sensor according to the eighth embodiment of this invention, the picture elements of the solid-state imaging element which have microlenses, namely, the lattice of photoelectric conversion parts, have a fine hexagonal close-packed structure. Such a solid-state imaging element is disclosed for example in Japanese Unexamined Patent Publication No. Sho 58-70204 (namely, 70204/1983) or IEEE Transaction of Electron Devices, Vol. 35, 1988, pp. 646–652, entitled "A New Device Architecture Suitable for High Resolution and High Performance Image Sensors" by J. Hynecek.

Specifically, the cores of the optical fiber bundle mounted on the element are arranged in the fine hexagonal close-packed structure shown in FIG. 5, and therefore have the same arrangement as that of the picture elements, i.e. the photoelectric conversion parts, of the solid-state imaging element. Both of the lattices have a period or a pitch substantially equal to each other.

Figure 11:
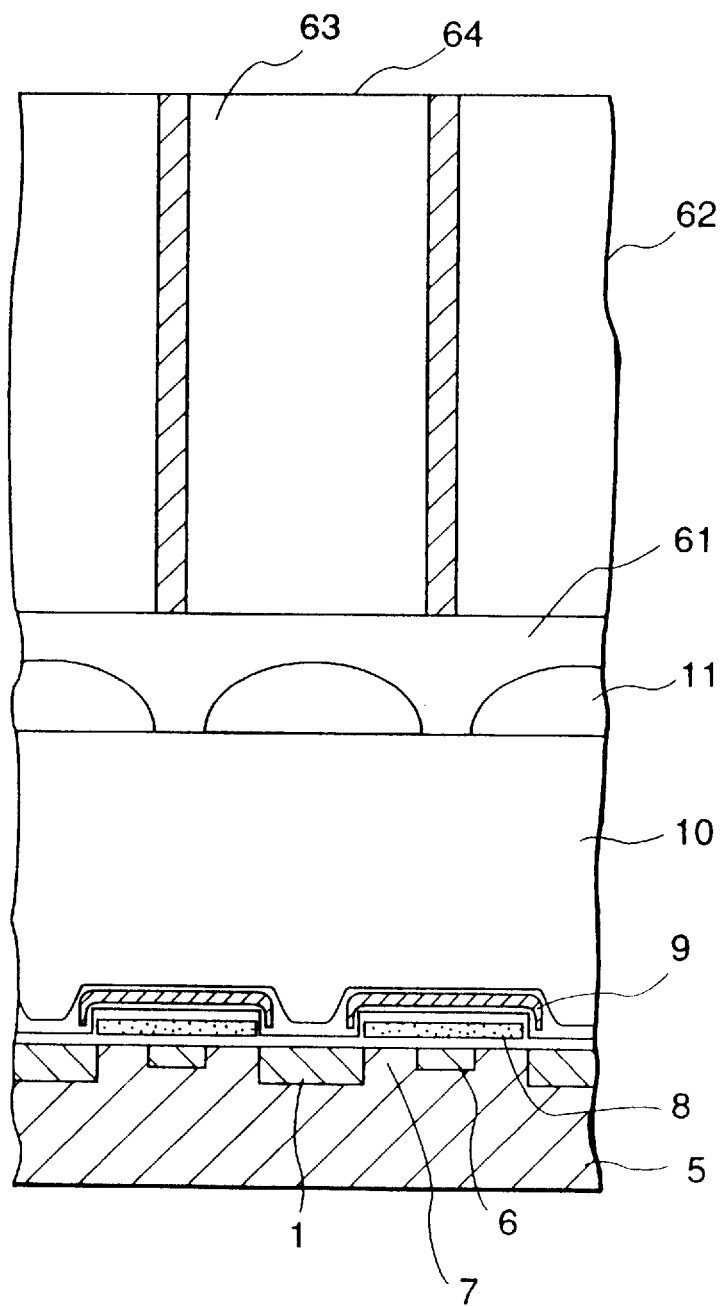
FIG. 11 is an enlarged sectional view of a solid-state image sensor according to an eighth embodiment of this invention.

An enlarged sectional view of a picture element part having the features of this invention is shown in FIG. 11. Component elements which are identical to those of FIG. 2, specified by a solid-state imaging element having microlenses mounted, are designated by the same reference symbols or numbers. In FIG. 11, an optical fiber bundle 62 is also mounted above the solid-state imaging element, and a filler 61 of transparent adhesive or the like is interposed between the bundle and the element. The optical fiber bundle 62 comprises cores 63, clad portions 64, and absorption films (not shown) placed between the clad portions 64. The centers of the cores 63 are arranged to coincide with the centers of the microlenses 11, and also to coincide with the centers of the openings of the photoelectric conversion parts. All the picture elements have the positional relationship mentioned above, so no fluctuation of sensitivity scattering is caused to occur between picture elements.

When the optical fiber bundle 62 is mounted on the solid-state imaging element, precise alignment should be done between the optical fiber bundle 62 and the lower element. However, any displacement or error inevitably occur therebetween. Even if such an error occurs, the effective aperture ratio is increased due to the presence of the microlenses 11. Therefore, the fluctuation of sensitivity can be effectively mitigated. Likewise, since the effective aperture ratio is very large, the fluctuation of sensitivity can be suppressed even when incoincidence is present between the period of picture elements of the solid-state imaging element and the period of the cores of the optical fiber bundle. Such incoincidence between the pitches or periods might result from manufacturing errors or differences between thermal expansion coefficients. In the solid-state image sensor according to this eighth embodiment, the case has been shown where both the picture elements of the solid-state imaging element and the cores of the optical fiber bundle are arranged in a fine hexagonal close-packed structure. However, the effect of the invention is invariable when both the picture elements and the cores are arranged in a square lattice shape.

Figure 3:
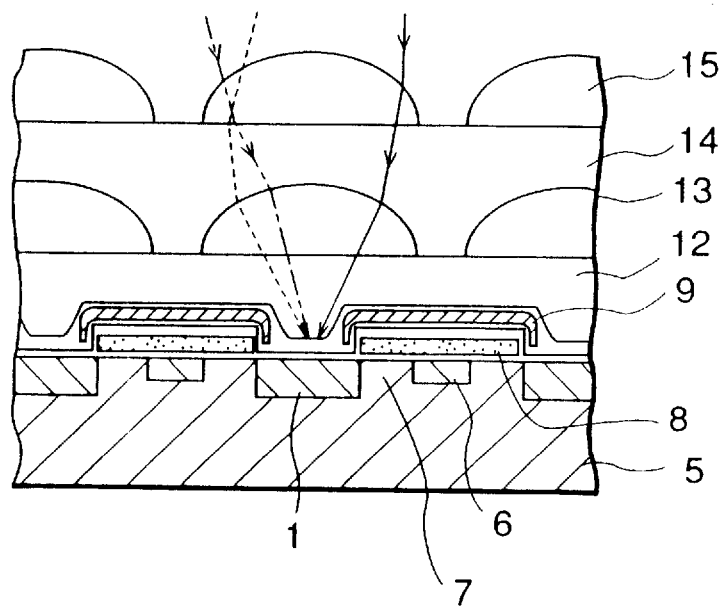
FIG. 3 is an enlarged sectional view of an another example of a conventional interline transfer CCD in which microlenses are formed.
Figure 4:
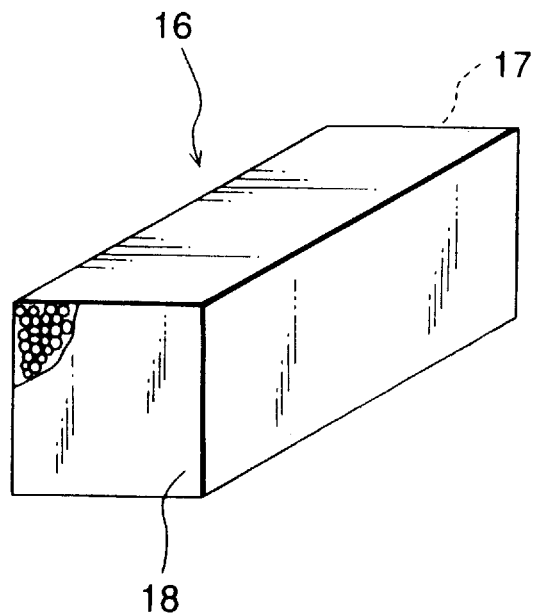
FIG. 4 shows the external appearance of a conventional optical fiber bundle.

In addition to the upward bulging microlenses of plastic resin as shown in the figures, two layers of bulging lenses may also be provided as shown in FIG. 3. The flat plate microlens disclosed in the Journal of the Institute of Telecommunications Engineers, Vol. 68, No. 12, Dec. 1985, pp. 1297–1300, "Advances in Microlenses", Section 4: "Distributed Refractive Index Flat Plate Microlenses", by Iga and Misawa, may also be used.

Figure 12:
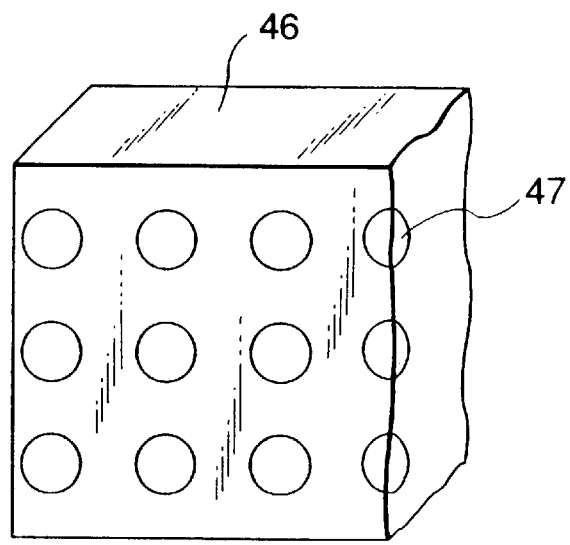
FIG. 12 is a partial view showing the structure of a flat microlens.

FIG. 12 shows a partial sectional view of a flat plate microlens. Refractive index distribution areas 47 are disposed in a square lattice shape on one principal surface of a transparent substrate 46. The refractive index in these areas 47 is larger than that of the transparent substrate 46, and larger in the center part than at the edges of these areas 47. These areas 47 therefore function as convex lenses. The refractive index distribution areas 47 may be fabricated by diffusion polymerization in plastic, ion exchange diffusion in glass or charge migration. This invention is also applicable to a solid-state image sensor including these microlenses. The invention has been described mainly referring to an embodiment where an interline transfer CCD is the solid-state imaging element. However, this invention is also applicable to solid-state imaging elements of other types, such as for example frame transfer CCD, MOS image sensors, CMOS image sensors and amplifying image sensors.

Although the invention has been described mainly in the case where the photoelectric conversion parts are disposed in a rectangular lattice shape comprising a square lattice shape, these conversion parts may be disposed in a triangular lattice shape or a fine hexagonal close-packed structure.

Figure 13:
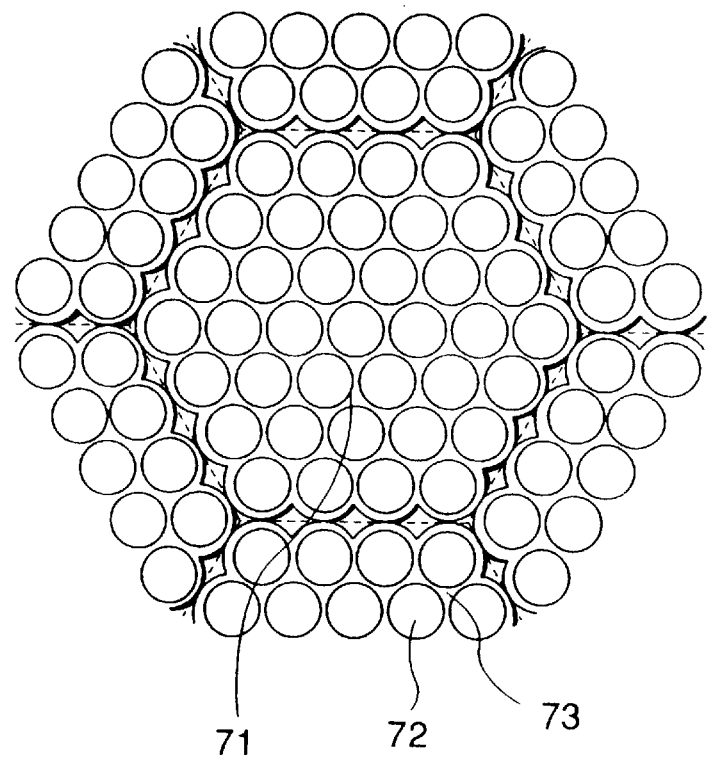
FIG. 13 is an enlarged sectional view of an optical fiber bundle having a multi-fiber structure.

The above description has been directed to the case where the cores of the optical fiber bundle are disposed in a fine hexagonal close-packed structure. However, this invention may be applied also to other arrangements of the cores, for example, a rectangular lattice shape including a square lattice shapes, or a triangular shape. Moreover, the effect of the invention can be accomplished even when the optical fiber bundle has a multi-fiber structure as shown in the enlarged sectional view of FIG. 13. Specifically, the multi-fiber structure is formed by first forming blocks 71 which are surrounded by the broken line in FIG. 13, and which are then assembled into an optical fiber bundle. Each of the blocks 71 comprises a plurality of cores 72, clad portions 73, and absorption films (not shown) which are located between two adjacent ones of the clad portions 72.

In the solid-state image sensor according to this invention, microlenses are favorably combined with the optical fiber bundle or the multi-fiber structure. Therefore, improvement can be achieved in connection with an effective aperture ratio, light usage efficiency, and sensitivity.

Moire fringes can be reduced which result from a difference between the type and period of the shape of photoelectric conversion parts of the solid-state imaging element, and the type and period of the shape of cores in the optical fiber bundle. Accordingly, no practical problem takes place. Also, a reflection rate on the output surface of the cores is reduced, which serves to enhance sensitivity.

Moreover, the aperture ratio of the photoelectric conversion parts is increased by the microlenses, so the alignment precision may be mitigated on mounting the optical fiber bundle on the element.

What is claimed is:

1. A solid-state image sensor comprising:
    a solid-state sensing element having photoelectric conversion parts formed in a two-dimensional shape in the principal surface of a semiconductor substrate,
    a microlens which corresponds to each of said photoelectric conversion parts and which is provided on the surface of said solid-state sensing element, and
    an optical fiber bundle which has optical fibers two-dimensionally arranged on said microlens.

2. A solid-state image sensor as claimed in claim 1, wherein the refractive index of a filler which mounts said optical fiber bundle on said microlens is less than the refractive index of said microlens and greater than the refractive index of a clad portion of each optical fiber used for said optical fiber bundle.

3. A solid-state image sensor as claimed in claim 1, wherein one end face of said optical fiber bundle is pressed onto said microlens.

4. A solid-state image sensor as claimed in claim 3, wherein a difference between the refractive index of said microlens and the refractive index of the cores of the optical fibers used for said optical fiber bundle is 0.3 or less, and the refractive index of a filler which mounts said optical fiber bundle on said microlens is less than the refractive index of said microlens and greater than the refractive index of the clad portion of each of said optical fibers used for said optical fiber bundle.

5. A solid-state image sensor as claimed in claim 1, wherein an array formed by said photoelectric conversion parts is the same as an array formed by said optical fibers, and a one-to-one correspondence exists between said photoelectric conversion parts and said optical fibers.

6. A solid-state image sensor comprising:

a solid-state sensing element having photoelectric conversion parts formed in a two-dimensional rectangular lattice shape in the principal surface of a semiconductor substrate, a microlens corresponding to each of said photoelectric conversion parts provided on the surface of said element, and an optical fiber bundle comprising optical fibers arranged in a two-dimensional fine hexagonal close-packed structure mounted on said microlens.

7. A solid-state image sensor as claimed in claim 6, wherein an angle between the shape formed by said photoelectric conversion parts and the shape formed by said optical fibers is between 10° and 20°, in order that points of the array formed by said photoelectric conversion parts and the points of the shape formed by said optical fibers do not overlap with a fixed period.

8. A solid-state image sensor comprising:

a solid-state sensing element having photoelectric conversion parts formed in a two-dimensional shape in the principal surface of a semiconductor substrate, a microlens corresponding to each of said photoelectric conversion parts provided on the surface of said element, and an optical fiber bundle composed of optical fibers arranged in a two-dimensional shape mounted on said microlens and having a period different from that of the shape of said photoelectric conversion parts.

* * * * *